United States Patent [19]

Welling

[11] Patent Number: 4,685,114
[45] Date of Patent: Aug. 4, 1987

[54] WAVEFORM MODULATION SYSTEM

[75] Inventor: Peter A. Welling, Melrose, Mass.

[73] Assignee: The Charles Stark Draper Laboratory, Inc., Cambridge, Mass.

[21] Appl. No.: 833,154

[22] Filed: Feb. 27, 1986

[51] Int. Cl.[4] ............................................... H03K 7/08
[52] U.S. Cl. ......................................... 375/22; 370/9; 364/143
[58] Field of Search ............ 375/22; 370/9; 332/9 R; 364/143; 360/40, 48; 340/347 DD

[56] References Cited

U.S. PATENT DOCUMENTS

| | | | |
|---|---|---|---|
| 4,001,728 | 1/1977 | Schneider | 375/22 |
| 4,085,287 | 4/1978 | Kullmann et al. | 375/22 |
| 4,129,751 | 12/1978 | Alles | 370/9 |
| 4,155,115 | 5/1979 | Wilske | 364/107 |
| 4,201,958 | 5/1980 | Ahamed | 370/9 |
| 4,428,007 | 1/1984 | Tanaka et al. | 360/44 |

*Primary Examiner*—Robert L. Griffin
*Assistant Examiner*—Stephen Chin
*Attorney, Agent, or Firm*—Joseph S. Iandiorio; Douglas E. Denninger

[57] ABSTRACT

An improved waveform modulation system for converting an input value having a known radix and a predetermined maximum number of digits into a waveform having successive intervals, by separating the input value into a least significant value portion occupying a preselected number of least significant digits and into a most significant value portion occupying a preselected number of most significant digits. For each interval, the system combines the least significant value portion with a residual value to produce a carry for that interval and a successive residual value. The system iteratively generates a waveform with successive intervals each having a duration defined by the preselected number of most significant digits and an underlying pulse width defined by the most significant value portion and modified according to the carry for that interval.

20 Claims, 6 Drawing Figures

WAVEFORM MODULATION SYSTEM

FIELD OF INVENTION

This invention relates to a high-speed, high-resolution waveform modulation system which converts an input value into a waveform having successive intervals and more particularly to such a system which modifies the pulse width of each interval by accumulated values. The system is particularly suited for producing motion control commands for precision instruments.

BACKGROUND OF INVENTION

There are a number of applications in which a value represented by a multibit digital word must be converted to a binary waveform. In some applications, the binary waveforms are utilized as control commands for regulating torque on precision instruments. For example, the control of gyros on a satellite requires rapid resolution of binary waveforms; the waveforms serve as the actual torquing voltage or current and drive power stage H-switches or I-switches.

Presently, binary waveforms are generated using delta sigma modulation or pulse width modulation. Delta sigma modulation systems produce a series of pulses each having a duration of frame $\tau$. The number of pulses, such as at +5 volts, compared to the number of frames without pulses, or zero volts, resolves an input value over time $T_{ds}$. Frame $\tau$ has a minimum duration based on the accuracy of switches which produce the discrete pulses.

After time $T_{ds}$ the system is strobed to accept a new input value. The input value can be viewed as a fractional value of time $T_{ds}$: for example, where nine is the input value and sixteen frames constitute time $T_{ds}$, the output value is 9/16 as shown by nine positive pulses produced over sixteen frames.

The generation of each pulse $\tau$ by a typical delta sigma modulation system may be expressed as follows. For an input value P which is expressed in M bits, A is the accumulated residual, and S is the successive residual; if (A+P) is less than $2^M$, where 2 is the radix, then $$S = A + P \tag{1}$$

and $$\text{output} = 0. \tag{2}$$

Where the sum of A and P is equal to or greater than $2^M$, then $$S = (A+P) - 2^M \tag{3}$$

and $$\text{output} = 1. \tag{4}$$

In other words, $2^M$ is the threshold at or above which a nonzero output is provided. After the output is determined by either equation (1) or (3), S is assigned to A. This operation is repeated for a total of $2^M$ times. During that period, the total number of positive pulses equals the input value P. If P is not altered during time $T_{ds}$, $$T_{ds} = R_{ds} = (2^M)(\tau) \tag{5}$$

where $R_{ds}$ is the time interval for complete resolution of P using the delta sigma modulation system. $R_{ds}$ has a lower limit based on which is determined by the accuracy of the switches which produce the pulse train. Net resolution does increase over time, however, due to carry-over of residual values.

Pulse width modulation systems produce a waveform having a positive pulse width which represents the input value. Successive rising edges define interval $T_{pw}$; the falling edge occurs as a multiple of time increment $\Delta t$. A lower boundary is set for increment $\Delta t$ by the maximum available clock rate and minimum possible switching time.

The operation of a typical pulse width modulation system may be expressed in terms of the occurrence of the falling edge of the positive pulse width. The time of occurrence of falling edge FE may be expressed as $$FE = P(\Delta t) \tag{6}$$

where P is the input value.

Unlike the delta sigma modulator, P cannot be altered during an interval. The resolution time $R_{pw}$ is always equivalent to interval $T_{pw}$ such that $$T_{pw} = R_{pw} = (2^N)(\Delta t) \tag{7}$$

where N is the number of bits, that is, place positions, of the input value and 2 is the radix. In other words, a waveform having a single pulse width is produced for each input value; the time interval of that waveform depends on the predetermined maximum number of total input bits which are raised as a power of the radix.

An advantage of pulse width modulation is that increment $\Delta t$ has a substantially shorter duration than frame $\tau$ because a drop or rise in current can be generated more rapidly and more accurately than the generation of a discrete pulse which contains both rising and falling edges. Based on typical switching constraints, frame $\tau$ has a duration of 10 $\mu$sec while increment $\Delta t$ has a duration of 0.2 $\mu$sec. Since $\Delta t$ is less than $\tau$, for N=M, comparing equations (5) and (7) reveals that $$T_{pw} = R_{pw} < R_{ds} = T_{ds} \tag{8}$$

The pulse width modulation system is capable of resolving an N bit input value more rapidly than the delta sigma modulation system.

The drawback to the pulse width modulation system is that when any two of the values $T_{pw}$, N, or $\Delta t$ are specified, the third must follow due to equation (7). The increment $\Delta t$ has a lower bound determined by the speed of the switches; once a switching technology has been selected, the optimum value for increment $\Delta t$ becomes fixed. Therefore, large values of N requires long intervals for resolution, and long intervals $T_{pw}$ reduce the frequency of the AC ripple in the waveform, which is deleterious in any application of binary waveforms. The length N of the input value received by the pulse width modulation system is limited by how low in frequency the AC ripple can be allowed to reside for the particular application.

The delta sigma modulation system does not suffer from this limitation on the length M of the input value. The frequency of the AC ripple in the delta sigma modulated waveform is determined primarily by the value of frame $\tau$. Large values of M require very long intervals for resolution, but the interval $T_{ds}$ has virtually no effect on the harmonic content of the AC ripple.

SUMMARY OF INVENTION

It is therefore an object of this invention to provide an improved waveform modulation system which exhibits, during a first time interval, resolution higher than that of a sigma modulation system and similar to that of a pulse width modulation system whose period is equivalent to the first time interval.

It is a further object of this invention to provide such a system which, unlike the pulse width modulation system, provides resolution which increases proportionally over time until a total resolution time is achieved without introducing significant low frequency AC ripple.

It is a further object of this invention to provide such a system which provides an estimation of an input value more rapidly than a pulse width modulation system whose period exceeds the time interval.

It is a further object of this invention to provide such a system which allows the data input rate, the bit clock rate, and the waveform frequency to be selected independently of each other.

It is a further object of this invention to provide such a system which can produce a high-speed, high-resolution binary output.

This invention results from the realization that a waveform modulation system that preserves the speed of a conventional pulse width modulation system and the smoothness of a delta sigma modulation system can be achieved by using a preselected number of most significant digits of an input value to define intervals of a waveform and using the value of those most significant digits to define the underlying pulse width of each interval and by modifying each pulse width with a carry from the sum of the value of the least significant digits and a previously derived residual value to iteratively produce a distributed pulse waveform that represents the input value.

This invention features an improved waveform modulation system for converting an input value having a known radix and a predetermined maximum number of preselected digits into a waveform having successive intervals. There are means for separating the input value into a least significant value portion occupying a preselected number of least significant digits and into a most significant value portion occupying a preselected number of most significant digits, means for storing a residual value, and means for combining, for each interval, the least ignificant value portion with the residual value from the means for storing to produce a carry for that interval and a successive residual value and for replacing the contents of the means for storing with the successive residual value. There is also means for iteratively generating a waveform having a duration defined by the total number of preselected digits and having successive intervals each having a duration defined by the preselected number of most significant digits and an underlying pulse width defined by the most significant value portion. The underlying pulse width is modified by the means for generating according to the carry for that interval.

In one embodiment, the duration of the waveform is defined by the total number of preselected digits raised as a power of the radix and the duration of each interval is defined by the preselected number of most significant digits raised as a power of the radix. Means for combining produces a non-zero carry when the combined value of the least significant value portion and the residual value is equal to or greater than the number of least significant digits raised as a power of the radix.

This invention also features an improved waveform modulation system including means for separating the input value into a least significant value portion occupying a preselected number of least significant digits and a most significant value portion occupying a preselected number of most significant digits, means for storing the residual value, and means for combining for each interval the least significant value portion with the residual value from the means for storing to produce a carry for that interval and a successive residual value and for replacing the contents of the means for storing with the successive residual value. There is also means for generating a waveform having successive intervals each having a pulse width based on the most significant portion and the carry for that interval.

In one embodiment, the means for generating includes means for adding for each interval the most significant value portion and the carry to produce a value sum and means for producing a waveform having successive intervals each having a pulse width modulated based on the magnitude of the value sum of that interval. The means for producing may include a count-down counter for defining the pulse width. In another construction, the means for generating includes means for establishing, for each interval, a pulse width based on the most significant value portion and includes means for modulating the pulse width for each interval based on the carry for that interval. The means for establishing may include a count-down counter for defining the pulse width. The means for combining may produce a carry having a non-zero value when the combined value of the least significant value portion and the residual value is greater than or equal to a predetermined threshold, such as radix$^M$, where M is the preselected number of least significant digits.

In a preferred embodiment, the means for generating generates each waveform having a duration based on radix$^N$, where N is the preselected number of most significant digits, and the means for separating includes memory means for storing the input value. The means for combining combines the least significant value portion and the residual value at a first rate and the means for separating accepts successive input values at a second, lower rate. The means for combining combines the least significant value portion and the residual value at the same rate that the means for generating generates each interval. The modulation system may further include means for setting to a predetermined value the residual value in the means for storing.

This invention further features a method of converting an input value into a waveform having successive intervals, including separating the input value into a least significant value portion occupying a preselected number of least significant digits and a most significant value portion occupying the preselected number of most significant digits and repeatedly, until a predetermined condition is achieved, combining for each interval a residual value with the least significant value portion to produce a carry for that interval and a successive residual value and generating successive intervals, each having a pulse width based on the most significant value portion and the carry for that interval. Each interval may have a duration based on radix$^N$ where N is the preselected number of most significant digits.

This invention may also be expressed as a method of converting an input value into a waveform having successive intervals including separating an input value into an integer portion and a fractional portion, combining the fractional portion with a first residual value to produce a first carry and a second residual value, and generating a first interval having a pulse width based on the first integer portion and the first carry. The method further includes combining the second residual value with the fractional portion to produce a second carry and a next residual value and generating a second interval having a pulse width based on the integer portion and the second carry. The method may further include repeatedly, until a predetermined condition is achieved, combining for each interval a residual value with the fractional portion to produce a carry for that interval and a successive residual value, and generating successive intervals, each having a pulse width based on the integer portion and the carry for that interval.

DISCLOSURE OF PREFERRED EMBODIMENT

Other objects, features and advantages will occur from the following description of preferred embodiments and the accompanying drawings, in which.

This invention may be accomplished by a waveform modulation system which separates an input value having a known radix and a predetermined maximum number $N+M$ of preselected digits into a least significant value portion—hereinafter referred to as the fractional portion—occupying a preselected number M of least significant digits and a most significant value portion—hereinafter referred to as the integer portion—occupying a preselected number N of most significant digits. The waveform modulation system combines the fractional portion first with an initial residual value and thereafter with a successive residual value to produce successive carries and successive residual values. The system generates a waveform having successive intervals which represents the input value such that each interval has a pulse width based on the value of the integer portion and the carry for that interval.

As described infra, an improved waveform modulation system according to this invention can be constructed from a delta sigma modulator which processes the M bits of the fractional portion and a pulse width modulator system which produces an interval having a time T based on the radix to the power of N and a pulse width based on the first integer portion, that occupies a maximum of N bits. The system according to this invention then modulates the pulse width based on the output from the delta sigma modulator portion, that is, based on the carry.

Figures 1, 2:
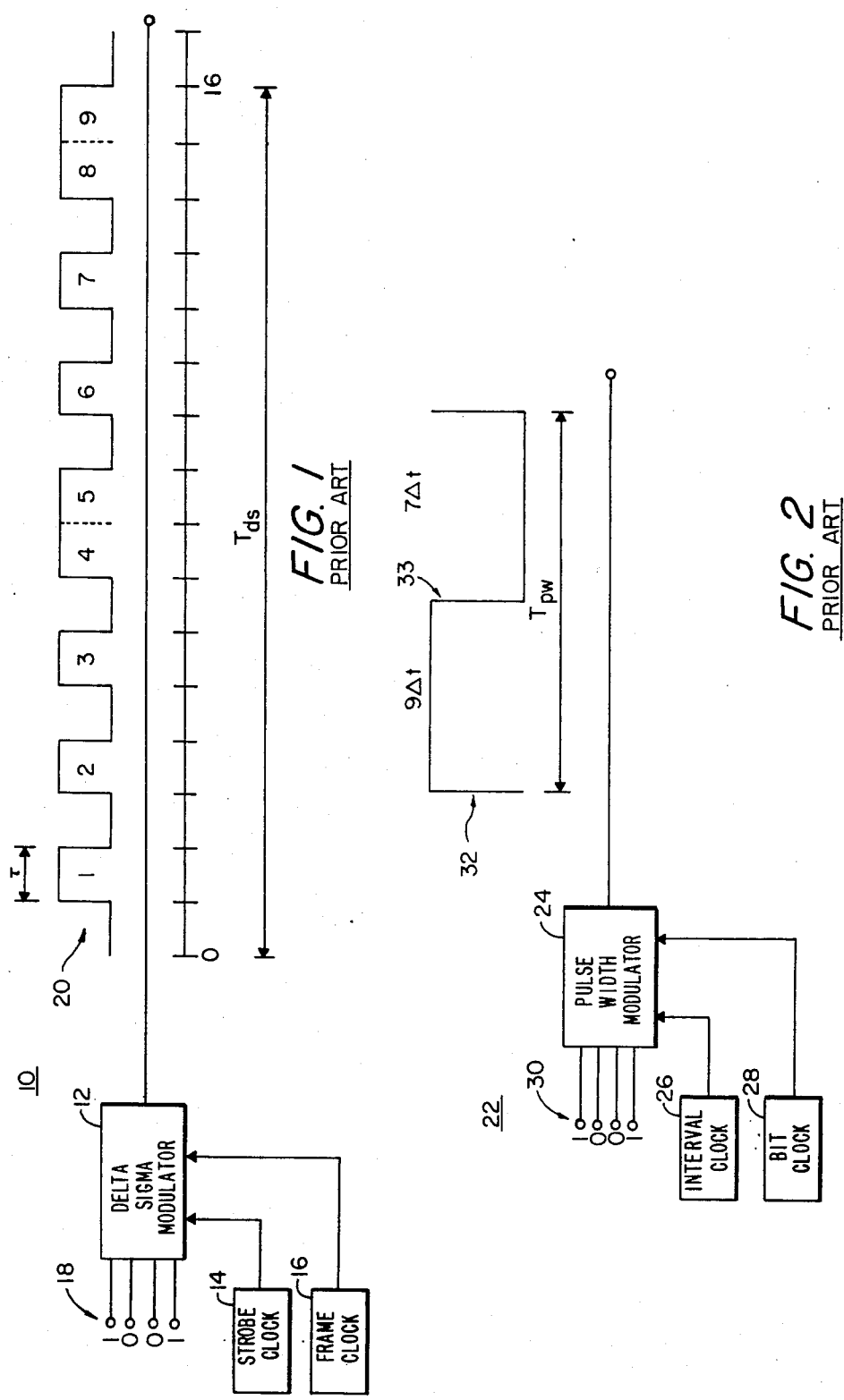
FIG. 1 is a schematic block diagram of a conventional delta sigma modulation system and its binary output for the value nine.
FIG. 2 is a schematic block diagram of a conventional pulse width modulation system and its output for the value nine.

To better appreciate the construction and operation of an improved waveform modulation system according to this invention, a conventional delta sigma modulation system and a conventional pulse width modulation system are shown in FIGS. 1, 2, respectively. Delta sigma modulation system 10, FIG. 1, includes delta sigma modulator 12, strobe clock 14, and frame clock 16. Time $T_{ds}$ is determined by strobe clock 14 and frame is determined by frame clock 16. When the input value is nine, represented in binary form by 1001, and is provided to input pins 18, pulse train 20 is generated by delta sigma modulation system 10: over sixteen frames, nine positive pulse frames are generated.

In response to the same input, rather than producing a series of pulses, pulse wave modulation system 22, FIG. 2, produces a waveform having a single pulse width for each value to be resolved. As described supra in relation to equation (8), increment $\Delta t$ is much shorter in duration than frame $\tau$ and interval $T_{pw}$ is therefore much shorter than time $T_{ds}$. Interval $T_{pw}$ for pulse modulator 24 is provided by interval clock 26. Within interval $T_{pw}$, the duration of increment $\Delta t$ is established by bit clock 28. For an input value of nine, expressed as binary 1001 and provided to input pins 30, waveform 32 is generated by pulse width modulation system 22. Falling edge 33 defines the width of the positive pulse representing the input value.

Unlike conventional modulation systems, an improved waveform modulation system according to this invention allows interval T to be selected independently of increment $\Delta t$ and input length $N+M$ and separates the frequency of the modulated waveform from the rate of data input. Improved waveform modulation system 34, FIG. 3, separates an input value at the input pins 35 into an integer portion q, pins 37, having N bits and a fractional portion r, at input pin 36, having M bits. Improved waveform modulator 38 is driven by three clocks, input update rate clock 40 which loads the input value, interval clock 42 which provides interval T, and bit clock 44 which generates increments $\Delta t$. The input value P is separated such that $$P = (q)(2^M) + r \qquad (9)$$

where q is the integer portion of P and r is the fractional portion of P. Fractional portion r is processed by circuits adapted from a delta sigma modulator as described infra. For a radix of 2, $2^M$ is the place value of the least significant bit of integer portion q and $$r < 2^M. \qquad (10)$$

Figure 3:
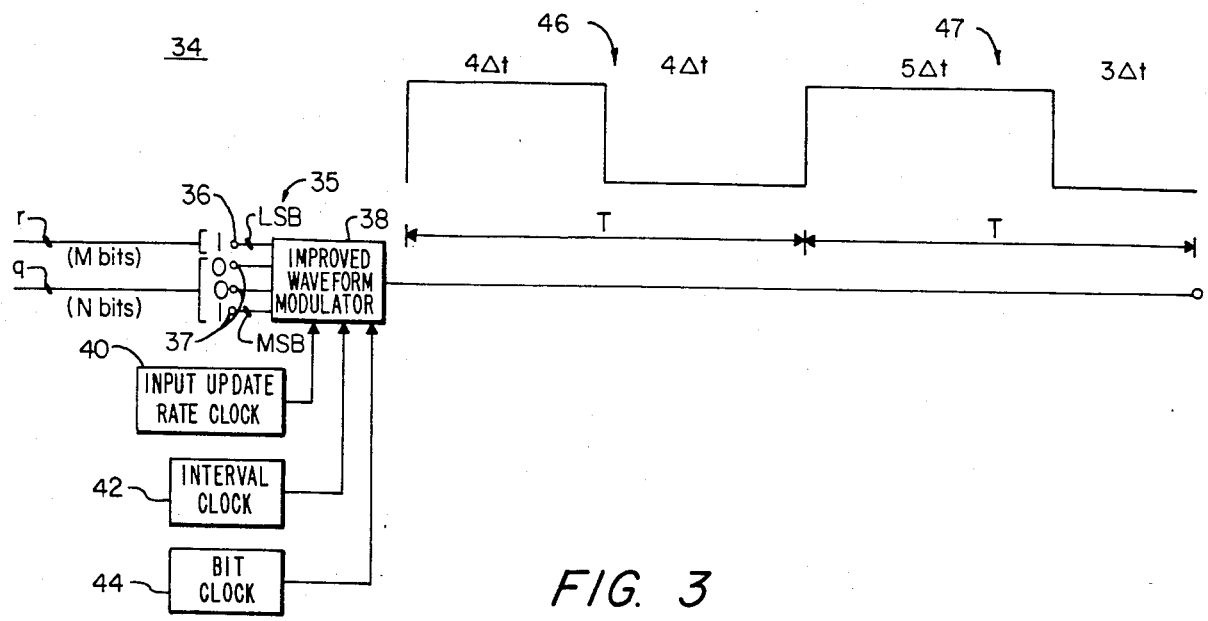
FIG. 3 is a schematic block diagram of an improved waveform modulation system according to this invention and its output of a value larger than its interval T.

As shown in FIG. 3, input value P is separated at input pins 36, 37 such that fractional portion r is represented by a single bit and integer portion q is represented by three bits. Interval T is the underlying period of improved waveform modulation system 34.

Unlike pulse width modulation system 22, FIG. 2, for which the period of its single waveform is shown in equation (7), the predetermined maximum number of bits N of integer portion q alone rather than the number of bits $N+M$ of the entire input P establishes the frequency of intervals 46, 47; interval duration T is equivalent to $(2^3) \Delta t$ rather than $(2^4) \Delta t$. The numerical expression of the value of the integer portion q for the N bits is 100 for radix 2 or 4 for radix 10. As described infra, the underlying pulse width is 4 $\Delta t$, as shown by interval 46, which can be extended by an additional Δt, as shown by the second pulse 5 Δt of interval 47.

The resolution time R is equivalent to the input update rate IUR such that $$IUR = R = (2^M)(T) \quad (11)$$

However, $$T = (\Delta t)(2^N) \quad (12)$$

so that, combining equations (11) and (12), $$R = (2^{M+N})(\Delta t) \quad (13)$$

In other words, resolution time R is equivalent to resolution time $R_{pw}$ for a conventional pulse width modulation system as shown in equation (7) and is therefore shorter than resolution time $R_{ds}$ for a conventional delta sigma modulation system.

Moreover, a single modulated pulse is generated by a pulse width modulation system over that time but a multitude of modulated pulses are produced by a system according to this invention. In other words, increasingly accurate approximations of the total value of the input signal emerges from improved waveform modulation system 34 before the end of successive interval $T_{pw}$. Comparing the systems shown in FIGS. 2 and 3, after 9 Δt, a value of ½ is generated by improved waveform modulation system 34 while pulse width modulation system 22 has not ended its positive pulse width. Since input value 9 is resolved in 16 Δt, and 9/16 is approximately ½, an estimation of the input value to the N most significant bits is generated by system 34 after a single interval T. This aspect of the improved waveform modulation system is further described infra in relation to Table I.

Figure 4:
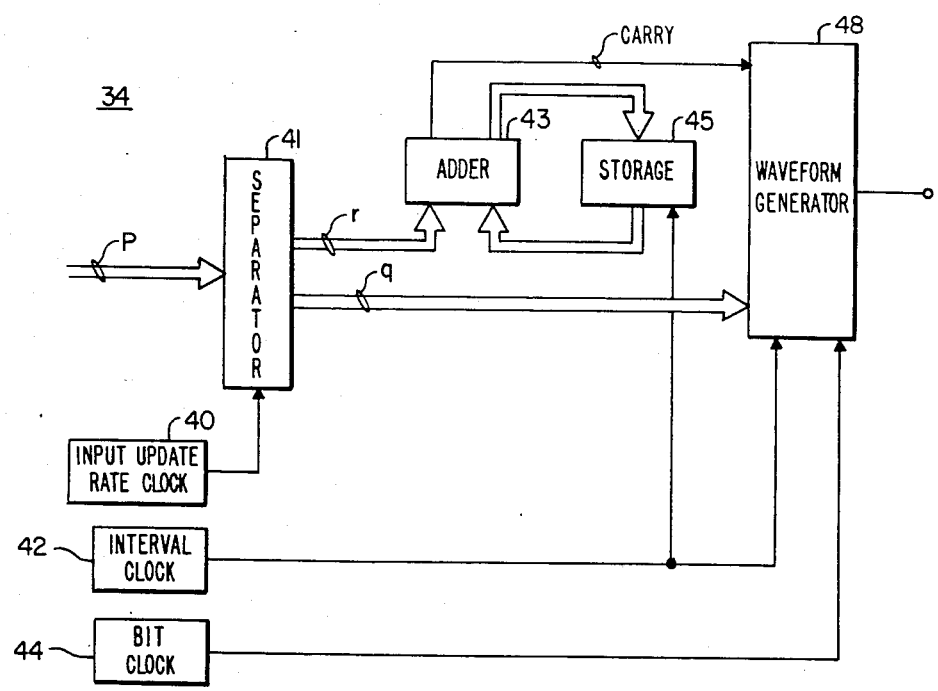
FIG. 4 is a more detailed block diagram of the waveform modulation system of FIG. 3.

A more detailed block diagram of waveform modulation system 34 is shown in FIG. 4. Input value P is provided, as timed by IUR clock 40, to separator 41 where it is separated into fractional portion r which is the least significant value portion occupying a preselected number of least significant digits M and into integer portion q which is the most significant value portion occupying a preselected number N of most significant digits. For complete resolution it is desirable that the total number of digits of the input value not exceed N+M digits. However, the input value can be estimated as described infra in relation to Table I using the value portions occupying the more significant digits of the input value.

To generate each interval of the waveform, waveform system 34 operates on integer portion q and fractional portion r in parallel as timed by interval clock 42. Fractional portion r is combined in adder 43 with a previously derived residual value stored in storage 45. The value of the sum in adder 43 which is less than the value of radix$^M$ is provided to storage 45 to serve as the residual value for the next interval.

The portion of the sum equal to or exceeding radix$^M$ is provided as a carry to waveform generator 48. Waveform generator 48 iteratively generates a waveform having a duration defined by the total number of digits raised as a power of the radix, as shown in equation (13). The waveform has successive intervals each having a duration defined by the number of most significant digits raised as a power of the radix and an underlying pulse width defined by the value of integer portion q. For each successive interval, waveform generator 48 modifies the underlying pulse width by the carry for that interval.

Figure 5:
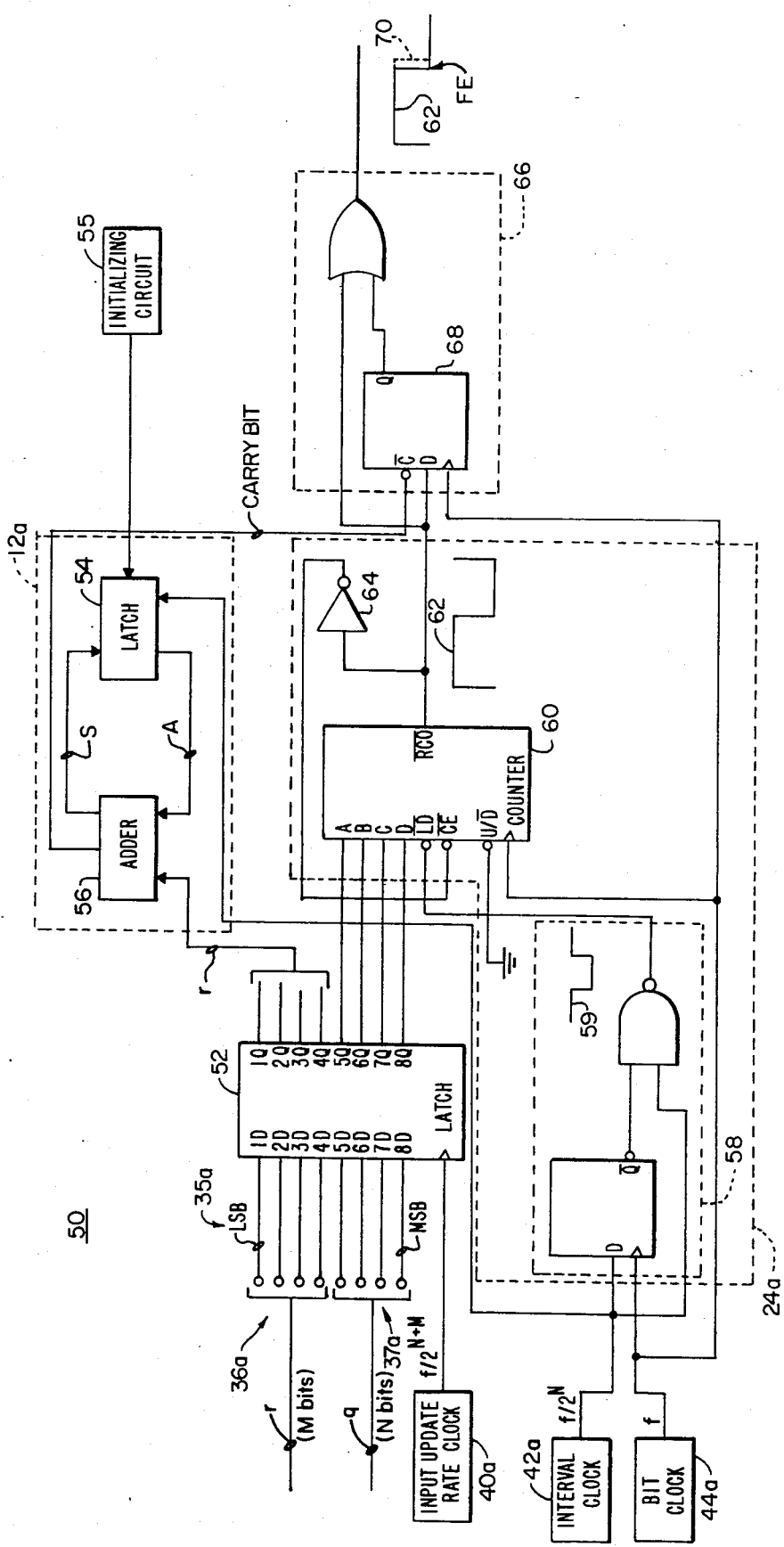
FIG. 5 is a more detailed schematic of an improved waveform modulation system.

A more detailed implementation of an improved waveform modulation system is shown in FIG. 5. Waveform modulation system 50 receives M bits of fractional portion r of an input value, including the least significant bit LSB at pins 36a of latch 52. N bits representing integer portion q of the input value, and including its most significant bit MSB, are received at pins 37a. The input value is loaded as commanded by IUR clock 40a having a frequency of $f/2^{N+M}$; bit clock 44a has a frequency f.

Typically, latch 54 is initialized by initializing circuit 55 to zero before latch 52 is loaded. For some applications latch 54 may be initialized to a nonzero value, such as $2^{M-1}$. During each interval having a frequency of $f/2^n$, interval clock 42a enables latch 54 to provide accumulated residual A to adder 56 where accumulated residual A is combined with fractional portion r. Circuit 12a is similar to delta sigma modulator 12, FIG. 1; however, interval T is substituted for frame τ. If accumulated residual A plus fractional portion r is less than then $2^M$, then $$S = (S + r) \quad (14)$$

where S is the successive residual and $$\text{carry bit} = 0 \quad (15)$$

When accumulated residual A plus fractional portion r is greater than or equal to $2^M$, then $$S = (A + r) - 2^M \quad (16)$$

and $$\text{carry bit} = 1 \quad (17)$$

After each cycle, S is assigned to A, i.e., latch 54 provides S to adder 56 as A for the next cycle. Unlike conventional delta sigma modulation systems, each cycle occurs during interval T and not during frame τ.

Pulse width circuit 24a includes edge detector 58 and countdown counter 60. Integer portion q is loaded into counter 60 when commanded by interval clock 42a whose rising edge is converted into a pulse by edge detector 58; inverted pulse 59 is provided to pin $\overline{\text{LD}}$. Counter 60 counts down according to the value of integer portion q at frequency f provide by bit clock 44a to produce positive pulse 62. Inverter 64, connected to count enable pin $\overline{\text{CE}}$, locks counter 60 at zero count at the end of pulse 62. This arrangement ensures that a signal level of zero is provided by counter 60 at ripple carry out pin $\overline{\text{RCO}}$ during the remainder of interval T.

While pulse width circuit 24a determines the underlying pulse width, the actual output of waveform modulation system 50 is determined by pulse stretcher 66 and the carry bit from delta sigma modulator circuit 12a. The occurrence of the falling edge FE is $$FE = (q)(\Delta t) \quad (18)$$

when the carry bit of modulator circuit 12a is zero. When the carry bit is a logical one, however, flip flop 68 is enabled low at pin $\overline{C}$ during interval T. Flip flop 68 then tracks the positive pulse provided to pin D for an additional increment Δt which extends, shown as dashed line 70, a positive pulse width 62 for that additional increment Δt. When pulse stretcher 66 is incremented by the carry bit during interval T, equation (18) becomes $$FE = (q+1)(\Delta t) \quad (19)$$

Improved waveform modulation system 50 utilizes separate clocks for interval T and input update rate IUR because the data input rate is much slower than the frequency of the modulated waveform. When N and M each are 4 bits, for example, and frequency f of bit clock 44a is 1.23 MHz, then frequency $f/2^N$ of interval clock 42a is 77 KHz, and update frequency $f/2^{N+M}$ is 4.8 KHz. The separation of waveform frequency from data input rate is especially desirable where a computer utilizes lengthy calculations to determine each input value and therefore has throughput restrictions.

Input update rate clock 40a need not have a frequency which is a binary submultiple of interval clock 42a or bit clock 44a. The three clock periods IUR, T, and Δt are preselected based on several criteria. Δt is based on circuitry constraints such as the ability of counter 60 and pulse stretcher 66 to produce an accurate falling edge FE or on the characteristics of the subsequent power stage. Interval T is based on the ripple of the output desired, that is, the tolerable frequency of the modulated waveform provided as the output of system 50. Rate IUR is based on the throughput rate of the computer providing input values to latch 52 or on the desired bit length of the input values. Setting the data input rate as a submultiple of the waveform frequency and the waveform frequency as a submultiple of the increment frequency provides improved resolution; however, an improved waveform system according to this invention functions satisfactorily without these relationships.

Once the three clock rates are designated, the separation of input value P into integer portion q and fractional portions r follows. When bit clock 44a is given a frequency of 1.23 MHz, interval clock 42a is given a rate of 9.6 KHz and clock 40b is given a rate of 300 Hz, for input value P having twelve bits integer portion q has seven bits and fractional portion r has five bits. If the rate of clock 40a has increased, integer portion q remains the same but fewer bits M of fractional portion r are incorporated into the final output. That is, N remains the same while M decreases and resolution decreases.

Waveform modulation system 50 operates on each input value until a predetermined condition is achieved. The condition can be complete resolution of the input value or resolution sufficient to provide a satisfactory estimation of the input value. As shown in Table I, the number of intervals T during which an improved waveform modulation system according to this invention operates determines the amount of resolution of the input value. The input value is estimated to N most significant bits after a single cycle for a binary system; the resolutions increases during successive intervals. Estimation of input value P to the nearest fraction of integer portion q is directly related to the number of intervals T of operation.

TABLE I

| ESTIMATION OF INPUT VALUE | |
|---|---|
| Number of Intervals T | Fraction of Integer Portion q |
| one | q |
| two | q/2 |
| three | q/3 |
| four | q/4 |
| . | . |
| . | . |
| eight | q/8 |

Figure 6:
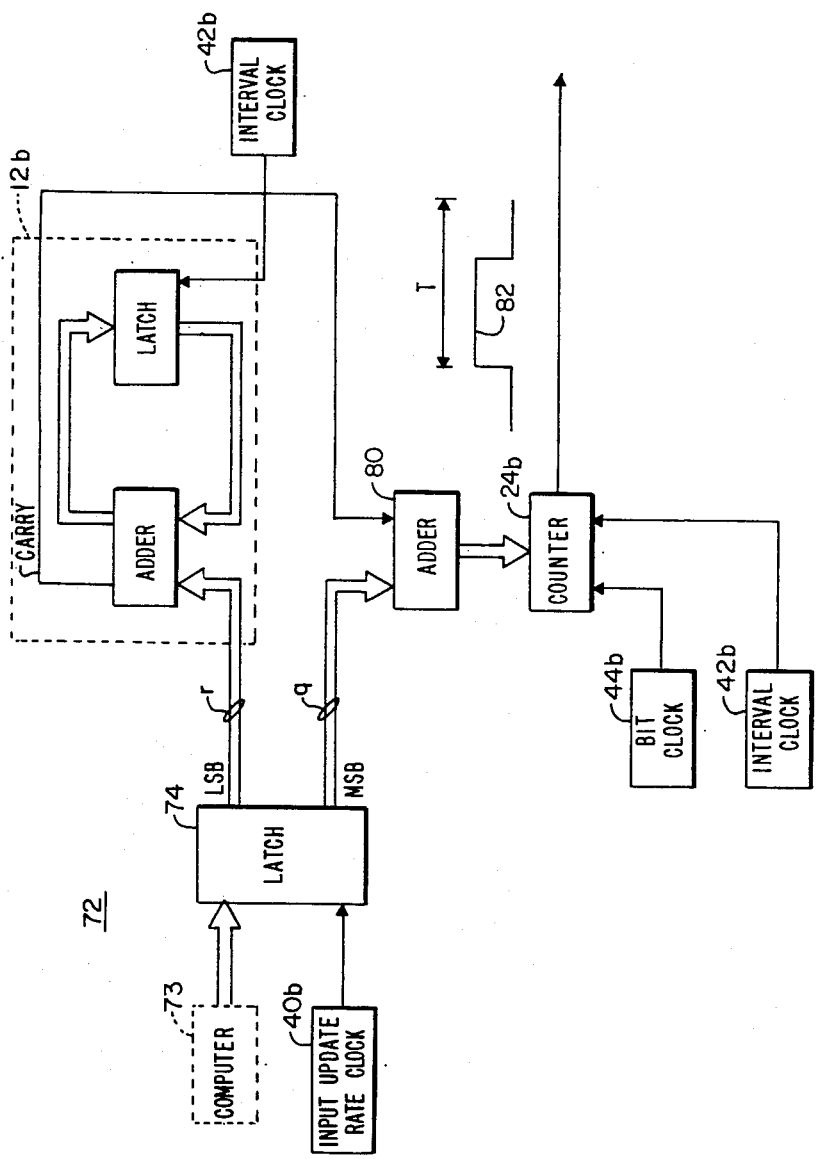
FIG. 6 a block diagram of another waveform modulation system according to this invention.

An alternative arrangement of an improved waveform modulation system is shown in FIG. 6. Improved waveform modulation system 72 receives an input signal from computer 73, shown in phantom, to latch 74 at a rate commanded by IUR clock 40b. As commanded by interval clock 42b, modulator circuit 12b provides as an output a carry bit of "0" or "1" to adder 80 once during each interval T. Adder 80 combines this carry bit with integer portion q. The sum is provided to countdown counter 24b whose interval T contains increments Δt provided by bit clock 44b. In contrast to system 50, FIG. 5, system 72 combines integer portion q with a carry produced by delta sigma modulator circuit 12b and then produces a waveform whose pulse width 82 is based on that sum.

Although specific features of the invention are shown in some drawings and not in others, this is for convenience only as each feature may be combined with any or all of the other features in accordance with the invention.

Other embodiments will occur to those skilled in the art and are within the following claims:

What is claimed is:

1. An improved waveform modulation system for converting an input value having a known radix and a predetermined maximum number of preselected digits into a waveform having successive intervals, comprising:
    means for separating the input value into a least significant value portion occupying a preselected number of least significant digits and into a most significant value portion occupying a preselected number of most significant digits;
    means for storing a residual value;
    means for combining, for each interval, said least significant value portion with said residual value from said means for storing to produce a carry for that interval and a successive residual value and for replacing the contents of said means for storing with said successive residual value; and
    means for iteratively generating a waveform having a duration defined by the total number of digits and having successive intervals each having a duration defined by the preselected number of most significant digits and an underlying pulse width defined by said most significant value portion, said underlying pulse width modified by said means for generating according to the carry for that interval.

2. The waveform modulation system of claim 1 in which the duration of the waveform is defined by the total number of digits raised as a power of the radix.

3. The waveform modulation system of claim 1 in which the duration of each interval is defined by the preselected number of most significant digits raised as a power of the radix.

4. The waveform modulation system of claim 1 in which said means for combining produces a nonzero carry when the combined value of said least significant value portion and said residual value is equal to or greater than the preselected number of least significant digits raised as a power of the radix.

5. An improved waveform modulation system for converting an input value having a known radix and a predetermined maximum number of digits into a waveform having successive intervals, comprising:
   means for separating the input value into a least significant value portion occupying a preselected number of least significant digits and into a most significant value portion occupying a preselected number of most significant digits;
   means for storing a residual value;
   means for combining, for each interval, said least significant value portion with said residual value from said means for storing to produce a carry for that interval and a successive residual value and for replacing the contents of said means for storing with said successive residual value; and
   means for generating a waveform having successive intervals each having a pulse width based on said most significant portion and said carry for that interval.

6. The waveform modulation system of claim 5 in which said means for generating includes:
   means for adding for each interval said most significant value portion and said carry for that interval to produce a value sum; and
   means for producing a waveform having successive intervals each having a pulse width modulated based on the magnitude of said value sum for that interval.

7. The waveform modulation system of claim 6 in which said means for producing includes a count-down counter for defining the pulse width.

8. The waveform modulation system of claim 5 in which said means for generating includes:
   means for establishing, for each interval, a pulse width based on said most significant value portion; and
   means for modulating the pulse width for each interval based on said carry for that interval.

9. The waveform modulation system of claim 8 in which said means for establishing includes a count-down counter for defining the pulse width.

10. The waveform modulation system of claim 5 in which said means for combining produces a carry having a nonzero value when the combined value of said least significant value portion and said residual value is equal to or greater than a predetermined threshold.

11. The waveform modulation system of claim 10 in which said threshold is based on radix$^M$ where M is the preselected number of least significant digits.

12. The waveform modulation system of claim 5 in which said means for generating generates each waveform having a duration based on radix$^N$ where N is the preselected number of most significant digits.

13. The waveform modulation system of claim 5 in which said means for separating includes memory means for storing said input value.

14. The waveform modulation system of claim 5 in which said means for combining combines said least significant value portion and said residual value at a first rate and said means for separating accepts successive input values at a second, lower rate.

15. The waveform modulation system of claim 5 in which said means for combining combines said least significant value portion and said residual value at the same rate that said means for generating generates each interval.

16. The waveform modulation system of claim 5 further including means for setting to a preselected value said residual value in said means for storing.

17. A method of converting an input value having a known radix and a predetermined maximum number of digits into a waveform having successive intervals, comprising:
   separating the input value into a least significant value portion occupying a preselected number of least significant digits and into a most significant value portion occupying a preselected number of most significant digits;
   combining for each interval a residual value with the least significant value portion to produce a carry for that interval and a successive residual value; and
   generating successive intervals, each having a pulse width based on the most significant value portion and the carry for that interval.

18. The method of claim 17 in which each interval has a duration based on radix$^N$ where N is the preselected number of most significant digits.

19. A method of converting an input value into a waveform having successive intervals, comprising:
   separating an input value into an integer portion and a fractional portion;
   combining the fractional portion with a first residual value to produce a first carry and a second residual value;
   generating a first interval having a pulse width based on the integer portion and the first carry;
   combining the second residual value with the fractional portion to produce a second carry and a next residual value; and
   generating a second interval having a pulse width based on the integer portion and the second carry.

20. The method of claim 19 further including producing additional intervals by repeatedly:
   combining for each additional interval a residual value with the fractional portion to produce a carry for that interval and a successive residual value; and
   generating the additional intervals, each having a pulse width based on the integer portion and the carry for that interval.

* * * * *